(12) United States Patent
Jiang et al.

(10) Patent No.: US 11,703,467 B2
(45) Date of Patent: Jul. 18, 2023

(54) ELECTRON BEAM DETECTION APPARATUS FOR SEMICONDUCTOR DEVICE AND ELECTRON BEAM DETECTION ASSEMBLY

(71) Applicant: ZHONGKE JINGYUAN ELECTRON LIMITED, BEIJING, Beijing (CN)

(72) Inventors: Lei Jiang, Beijing (CN); Yan Zhao, Beijing (CN)

(73) Assignee: ZHONGKE JINGYUAN ELECTRON LIMITED, BEIJING, Beijing (CN)

( * ) Notice: Subject to any disclaimer, the term of this patent is extended or adjusted under 35 U.S.C. 154(b) by 121 days.

(21) Appl. No.: 17/299,199

(22) PCT Filed: Dec. 26, 2019

(86) PCT No.: PCT/CN2019/128760
§ 371 (c)(1),
(2) Date: Jun. 2, 2021

(87) PCT Pub. No.: WO2021/103250
PCT Pub. Date: Jun. 3, 2021

(65) Prior Publication Data
US 2022/0317071 A1    Oct. 6, 2022

(30) Foreign Application Priority Data

Nov. 27, 2019   (CN) .......................... 201911179973.5

(51) Int. Cl.
*G01N 23/2251*    (2018.01)
(52) U.S. Cl.
CPC ..... *G01N 23/2251* (2013.01); *G01N 2223/07* (2013.01); *G01N 2223/3308* (2013.01);
(Continued)

(58) Field of Classification Search
CPC .......... G01N 23/2251; G01N 2223/07; G01N 2223/3308; G01N 2223/418;
(Continued)

(56) References Cited

U.S. PATENT DOCUMENTS 5,686,994 A * 11/1997 Tokura ............... H05K 13/0815
348/126
5,760,901 A * 6/1998 Hill .................... G01B 9/02027
356/450
(Continued)

FOREIGN PATENT DOCUMENTS

CN    1104329 A    6/1995
CN    1815186 A    8/2006
(Continued)

OTHER PUBLICATIONS

"International Search Report and Written Opinion of the International Searching Authority", International Application No. PCT/CN2019/128760, dated Sep. 2, 2020, 9 pp.
(Continued)

*Primary Examiner* — David A Vanore
(74) *Attorney, Agent, or Firm* — Myers Bigel, P.A.

(57) ABSTRACT

An electron beam detection apparatus for a semiconductor device and an electron beam detection assembly are disclosed, the electron beam detection apparatus including a stage, which is configured to carry and hold the semiconductor device at a top surface of the stage, and is translatable in two directions orthogonal to each other, an aiming device, configured to determine a position of the semiconductor device in a coordinate system of the electron beam detection apparatus by capturing an image of the semiconductor device, the aiming device provided with a first field of view and a first optical axis, and an electron beam detection device, configured to detect an emergent electron beam exiting the semiconductor device by projecting an electron
(Continued)

beam to the semiconductor device, the electron beam detection device provided with a second field of view and a second optical axis which is not consistent with the first optical axis.

16 Claims, 5 Drawing Sheets

(52) U.S. Cl.
CPC . *G01N 2223/418* (2013.01); *G01N 2223/507* (2013.01); *G01N 2223/6116* (2013.01); *G01N 2223/646* (2013.01)

(58) Field of Classification Search
CPC ..... G01N 2223/507; G01N 2223/6116; G01N 2223/646; H01J 37/20; H01J 37/22; H01J 2237/20285; H01J 2237/26; H01J 37/05; H01J 37/21; G06T 2207/10061; G06T 2207/30148; G06T 7/0004; H01L 22/12
See application file for complete search history.

(56) References Cited

U.S. PATENT DOCUMENTS

| | | | | |
|---|---|---|---|---|
| 6,061,323 | A * | 5/2000 | Jerman | G11B 11/10543 369/112.29 |
| 7,897,942 | B1 * | 3/2011 | Bareket | G03B 27/62 250/398 |
| 8,894,637 | B2 * | 11/2014 | Ben-Yakar | A61B 5/0059 606/16 |
| 9,267,903 | B2 * | 2/2016 | Park | G01N 23/2251 |
| 9,998,658 | B2 * | 6/2018 | Ou | G02B 27/58 |
| 11,092,902 | B2 * | 8/2021 | D'Achard Van Enschut | G01B 11/30 |
| 2007/0181808 | A1 * | 8/2007 | Murakoshi | H01J 37/29 250/310 |
| 2007/0246655 | A1 * | 10/2007 | Trissei | G21K 4/00 250/361 R |
| 2013/0027543 | A1 * | 1/2013 | Boeykens | G01R 31/2656 348/92 |
| 2014/0183357 | A1 * | 7/2014 | Smith | H01J 37/20 250/307 |
| 2014/0312227 | A1 * | 10/2014 | Yoshikawa | H01J 37/023 250/310 |
| 2015/0022787 | A1 * | 1/2015 | Yang | F21V 9/30 250/201.1 |
| 2015/0287570 | A1 * | 10/2015 | Hayashi | H01J 37/224 250/310 |
| 2017/0084019 | A1 * | 3/2017 | Lin | H04N 13/204 |
| 2018/0358199 | A1 * | 12/2018 | Kumamoto | H01J 37/22 |
| 2019/0198288 | A1 * | 6/2019 | Maazouz | H01J 37/3056 |
| 2019/0198289 | A1 * | 6/2019 | Gledhill | H01J 37/28 |
| 2019/0259568 | A1 * | 8/2019 | Suzuki | H01J 37/08 |
| 2020/0043693 | A1 * | 2/2020 | Dinu-Gurtler | H01J 37/3174 |
| 2021/0265129 | A1 * | 8/2021 | Ogawa | G01C 3/08 |

FOREIGN PATENT DOCUMENTS

| | | |
|---|---|---|
| CN | 1820346 A | 8/2006 |
| CN | 102809881 A | 12/2012 |
| CN | 103765567 A | 4/2014 |
| CN | 104870986 A | 8/2015 |
| CN | 206480587 U | 9/2017 |
| CN | 109502543 A | 3/2019 |
| CN | 109979793 A | 7/2019 |
| CN | 110176378 A | 8/2019 |
| JP | 11265675 A * | 9/1999 |
| JP | H11265675 A | 9/1999 |
| JP | 2006339169 A | 12/2006 |
| JP | 2013114070 A | 6/2013 |
| JP | 6386679 B2 | 8/2018 |
| TW | 201712317 A | 4/2017 |
| TW | 201903806 A | 1/2019 |

OTHER PUBLICATIONS

"First Office Action and English language translation", CN Application No. 201911179973.5, dated Aug. 24, 2020, 25 pp.
"Office Action", TW Application No. 109141193, dated Jan. 5, 2022, 5 pp.
"Second Office Action and English language translation", CN Application No. 201911179973.5, dated Feb. 22, 2021, 7 pp.
Office Action for corresponding JP application No. 2021-547564 dated Jun. 28, 2022, with translation, 6 pages.

* cited by examiner

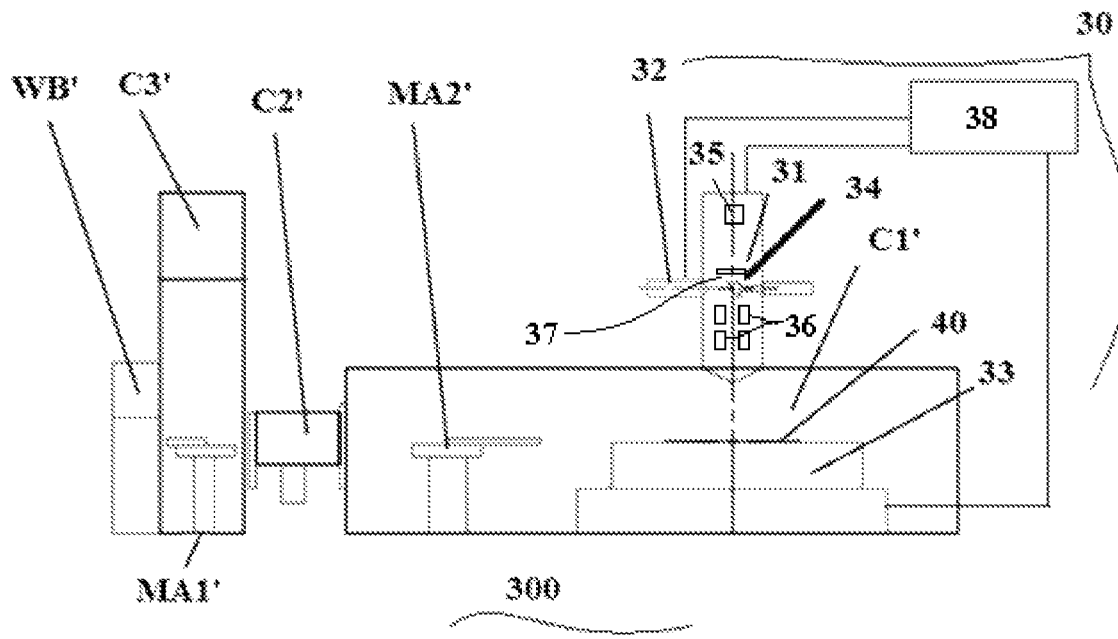

Fig. 7 control the stage to translate depending on an alignment scheme as preset so as to move the semiconductor device into the first visible region

determine the position of the semiconductor device in the coordinate system of the electron beam detection apparatus by processing the image of the semiconductor device which is captured by the aiming device

to control the stage to move the region to be detected on the semiconductor device into the second visible region from the first visible region

Fig. 8

ELECTRON BEAM DETECTION APPARATUS FOR SEMICONDUCTOR DEVICE AND ELECTRON BEAM DETECTION ASSEMBLY

CROSS-REFERENCE TO RELATED INVENTION

This application is a Section 371 National Stage Application of International Application No. PCT/CN2019/128760, filed on Dec. 26, 2019, entitled "ELECTRON BEAM DETECTION APPARATUS FOR SEMICONDUCTOR DEVICE AND ELECTRON BEAM DETECTION ASSEMBLY", which claims the benefit of Chinese Patent Application Invention No. 201911179973.5 filed on Nov. 27, 2019 in the China National Intellectual Property Administration, the whole disclosure of which is incorporated herein by reference.

BACKGROUND OF THE DISCLOSURE

Field of the Disclosure

The present disclosure relates to the technical field of semiconductor detection, in particular to an electron beam detection apparatus for a semiconductor device, and an electron beam detection assembly.

Description of the Related Art

In a manufacturing process of a semiconductor device (e.g., a semiconductor silicon wafer), an electron beam detection device, for example a scanning electron microscope, is used to detect defects of the semiconductor device which appear in the manufacturing process (e.g., by implementing a detection of pattern(s) of the silicon wafer), the defects comprising but being not limited to detects of the silicon wafer incurred in a lithography process implemented thereon, defects of the silicon wafer incurred in an exposure process implemented thereon, and the like. The electron beam detection device operates on the basis of a main operating principle lying in that, a high-power electron beam is used to impinge on a surface of an object to be detected, and secondary electrons, backscattered electrons and the like are then generated by the impingement of the electron beam on the surface, and are captured to generate an electric signal embodying various kinds of physical and chemical information of the object to be detected, such as surface topography of the surface of the object to be detected, components of the object to be detected, and the like.

SUMMARY OF THE DISCLOSURE

The embodiments of the present disclosure have been made to overcome or alleviate at least one aspect of the above mentioned disadvantages and/or shortcomings in the relevant art, by providing an electron beam detection apparatus for a semiconductor device and an electron beam detection assembly.

According to one aspect of embodiments of the disclosure, there is provided an electron beam detection apparatus for a semiconductor device, comprising: a stage, which is configured to carry and hold the semiconductor device at a top surface of the stage, and is translatable in two directions orthogonal to each other; an aiming device, configured to determine a position of the semiconductor device in a coordinate system of the electron beam detection apparatus by capturing an image of the semiconductor device, the aiming device being provided with a first field of view and a first optical axis; and an electron beam detection device, configured to detect an emergent electron beam exiting the semiconductor device by projecting an electron beam to the semiconductor device, the electron beam detection device being provided with a second field of view and a second optical axis which is not consistent with the first optical axis, the electron beam detection apparatus further comprising a reflecting device configured to image a region to be detected on the semiconductor device into the aiming device by reflection of the region to be detected on the semiconductor device implemented by the reflecting device towards the aiming device; and the first field of view being projected onto a first visible region of the top surface by reflection of the reflecting device, and the second field of view being projected onto a second visible region of the top surface along an optical path of the electron beam.

According to embodiments of the disclosure, the first optical axis is at a non-zero angle with reference to the second optical axis, and the first visible region and the second visible region are arranged to space apart from each other at their respective centers or arranged concentrically with each other at their respective centers.

According to embodiments of the disclosure, in response to the first visible region and the second visible region being arranged concentrically with each other at their respective centers, the reflecting device is switchable between a first position at which the region to be detected on the semiconductor device is imaged into the first field of view of the aiming device by reflection of the region to be detected on the semiconductor device implemented by the reflecting device located thereat and a second position deviating from the optical path of the electron beam.

According to embodiments of the disclosure, the reflecting device is movable between the first position and the second position.

According to embodiments of the disclosure, the reflecting device is rotatable between the first position and the second position.

According to embodiments of the disclosure, in response to the reflecting device being located at the first position, the electron beam detection device is turned off, and the region to be detected on the semiconductor device is located within the first visible region; and in response to the reflecting device being located at the second position, the electron beam detection device is turned on, and the region to be detected on the semiconductor device is located within the second visible region.

According to embodiments of the disclosure, the first position is in the optical path of the electron beam.

According to embodiments of the disclosure, the first optical axis and the second optical axis intersect with each other at a non-zero angle.

According to embodiments of the disclosure, the first optical axis and the second optical axis intersect with each other orthogonally.

According to embodiments of the disclosure, the first optical axis is parallel to the top surface, while the second optical axis is perpendicular to the top surface.

According to embodiments of the disclosure, at the first position, a normal of a reflecting surface of the reflecting device is coplanar with both the first optical axis and the second optical axis, and is at an angle of 45° with reference to each of the first optical axis and the second optical axis.

According to embodiments of the disclosure, the first optical axis and the second optical axis intersect with each other obliquely.

According to embodiments of the disclosure, the aiming device is an optical microscope.

According to embodiments of the disclosure, the electron beam detection device comprises: an electron beam source, configured to emit the electron beam as an incident electron beam; a deflector, configured to deflect the incident electron beam onto a surface to be detected of the semiconductor device; and an electronic detector, configured to image the surface to be detected of the semiconductor device, by detecting the emergent electron beam which is generated by projecting the incident electron beam onto the surface to be detected and then exists the surface to be detected of the semiconductor device.

According to embodiments of the disclosure, the electron beam detection apparatus further comprises a control circuit, the control circuit being configured to control the stage to translate depending on an alignment scheme as preset so as to move the semiconductor device into the first visible region, to determine the position of the semiconductor device in the coordinate system of the electron beam detection apparatus by processing the image of the semiconductor device which is captured by the aiming device, and to control the stage to move the region to be detected on the semiconductor device into the second visible region from the first visible region.

According to embodiments of the disclosure, the reflecting device comprises one of the following: a plane mirror, a curved mirror, a reflecting prism.

According to another aspect of the exemplary embodiment of the present disclosure, there is provided an electron beam detection assembly, comprising: a detection module and a transmission module, the detection module comprising: a first chamber whose interior is in a vacuum condition; and the electron beam detection apparatus as described above, which is located within the first chamber; and the transmission module comprising: a second chamber, which is provided adjacent to the first chamber, the second chamber communicating at one side thereof with the first chamber via a first valve, and communicating at the other side thereof opposite to the one side with an atmospheric environment via a second valve; a first mechanical arm, which is provided outside the second chamber and configured to move the semiconductor device into the second chamber from the atmospheric environment; and a second mechanical arm, which is provided within the first chamber and configured to move the semiconductor device into the first chamber from the second chamber, and in turn to the top surface of the stage.

According to embodiments of the disclosure, the second chamber is configured to be vacuumized when the first valve and the second valve are turned off simultaneously.

According to embodiments of the disclosure, a volume of the second chamber is smaller than that of the first chamber.

BRIEF DESCRIPTION OF THE DRAWINGS

Embodiments of the disclosure are depicted merely by way of example, by referring to accompanying schematic drawings at present, wherein corresponding reference numerals in the drawings represent corresponding components. The drawings are briefly depicted as follows:

FIG. 7 illustrates a structural schematic view of an electron beam detection assembly comprising the electron beam detection apparatus as illustrated in FIGS. 4A to 4D; and FIG. 8 illustrates an exemplary workflow of a control circuit of the electron beam detection apparatus.

DETAILED DESCRIPTION OF EMBODIMENTS OF THE INVENTION

Figure 1:
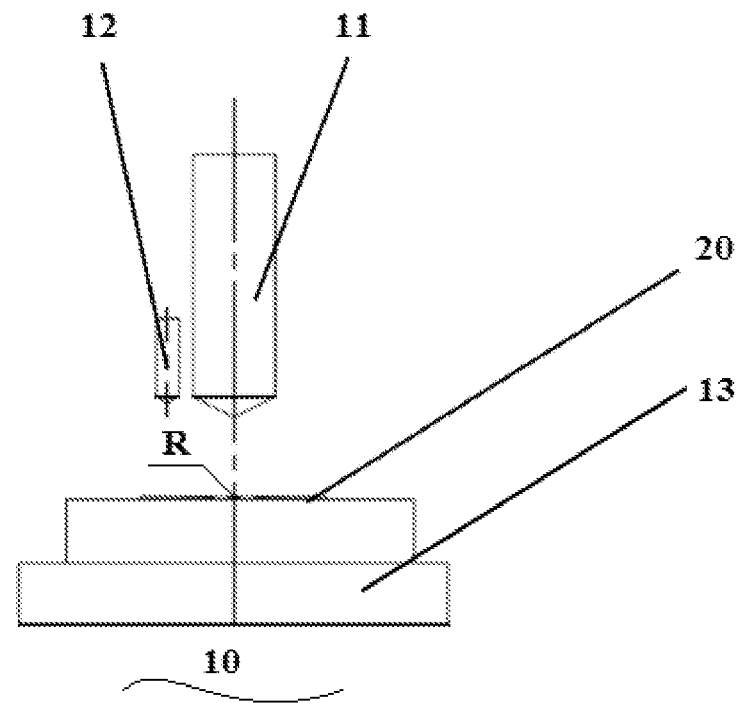
FIG. 1 illustrates a structural schematic view of an exemplary electron beam detection apparatus, which comprises an aiming device and an electron beam detection device.

The technical scheme of the present disclosure will be further explained in detail in combination with the accompanying drawings. In the specification, the same or similar reference numerals and letters indicate the same or similar parts. The following description of embodiments of the present disclosure with reference to the accompanying drawings is intended to explain the general inventive concept of the present disclosure and should not be construed as a limitation of the present disclosure.

The accompanying drawings are used to illustrate the contents of the present disclosure. The dimensions and shapes of the components in the drawings do not reflect the true proportions of the components of an electron beam detection apparatus for a semiconductor device and an electron beam detection assembly.

Typically, an electron beam detection apparatus comprises an electron beam detection device (e.g., a scanning electron microscope) and a stage capable of performing a planar two-dimensional motion (or even a three-dimensional motion comprising both the planar two-dimensional motion and a motion in Z direction).

In consideration that for example in the electron beam detection device for detection of defects in pattern(s) of a silicon wafer, although both its magnification and resolution are relatively high, a relatively small spot is formed by an electron beam which is projected therefrom onto an object to be detected (e.g., the silicon wafer) due to a relatively small beam diameter of the electron beam; that is to say, the electron beam detection device has a relatively small observable range or size of a field of view.

Therefore, in exemplary embodiments, as to the electron beam detection apparatus, in order to facilitate an accurate and rapid delivery of a pattern of a specific region of the object to be detected into the field of view of the electron beam detection device in a detection process of the electron beam detection apparatus, without moving the stage multiple times for implementing an adjustment in positioning the object to be detected, then, by way of example, an optical aiming device which has functionalities of pre-alignment and coarse positioning for the object to be detected may be additionally provided in the electron beam detection apparatus, which implements a determination of a specific position of the object to be detected in a device coordinate system of the whole electron beam detection apparatus.

Figure 2:
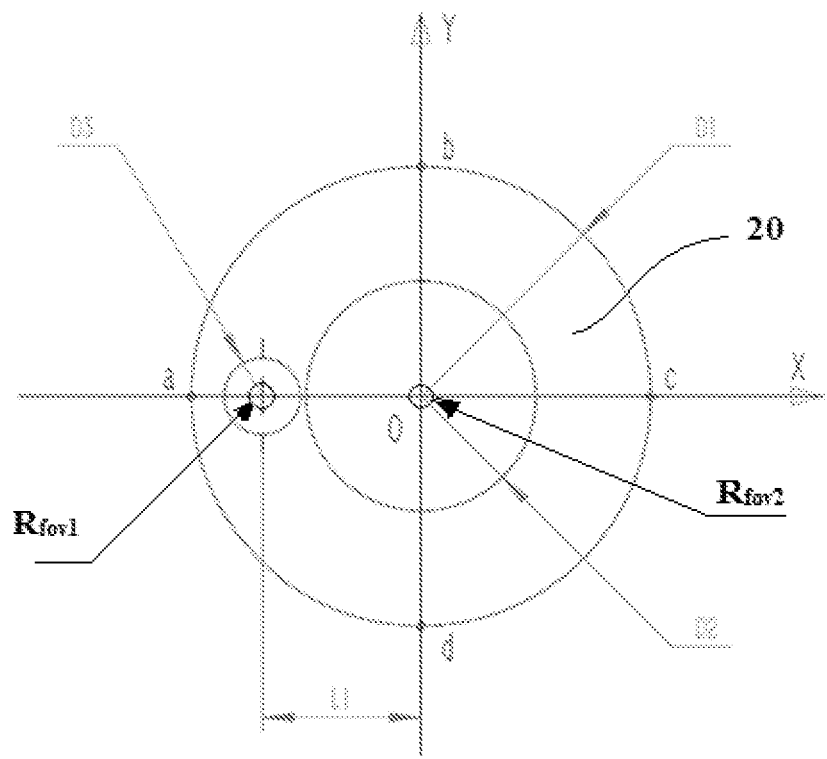
FIG. 2 illustrates in a top view, respective visible regions of both the aiming device and the electron beam detection device, in the electron beam detection apparatus as illustrated in FIG. 1.

Specifically, FIG. 1 illustrates a structural schematic view of an exemplary electron beam detection apparatus, which comprises an aiming device and an electron beam detection device; FIG. 2 illustrates in a top view, respective visible regions of both the aiming device and the electron beam detection device, in the electron beam detection apparatus as illustrated in FIG. 1.

As illustrated in FIG. 1, in exemplary embodiments, an electron beam detection apparatus 10 comprises: an electron beam detection device 11, a stage 13, and an aiming device 12 which is additional provided. Specifically, the electron beam detection apparatus 11 is a scanning electron microscope for example in the form of an electron beam lens barrel as illustrated, and is configured to generate an electron beam impinging on a specific region on a surface of a object to be detected 20 (e.g., a silicon wafer to be detected) and to acquire or capture and to detect signals of secondary electrons, backscattered electrons and the like which are generated by the impingement of the electron beam on the specific region of the object to be detected, simultaneously. The signals are processed by amplification so as to obtain topographical characteristics of the specific region on the surface of the object to be detected 20 (e.g., the silicon wafer to be detected), for example, for determining whether the pattern of the specific region is defective. The aiming device 12 is for example an optical microscope which is configured to determine the specific position of a semiconductor device for example functioning as the object to be detected 20 in a coordinate system of the electron beam detection apparatus, by acquiring an image of the semiconductor device. The aiming device has a first field of view and a first optical axis, and the electron beam detection device has a second field of view and a second optical axis which is not consistent with the first optical axis; for example, the aiming device and the electron beam detection device 11 are provided side by side, as illustrated, and more specifically, the aiming device is arranged such that the first optical axis thereof is parallel to the second optical axis of the electron beam detection device 11 (for example, both the first optical axis and the second optical axis are perpendicular to a top surface of the stage 13), and is configured to implement a coarse positioning of the object to be detected (e.g., the silicon wafer to be detected) and in turn to determine the specific position of the pattern of the object to be detected 20 in the device coordinate system of the whole electron beam detection apparatus. The stage 13 is for example placed horizontally, and is configured to hold and carry the object to be detected 20 (e.g., the silicon wafer to be detected) and to implement a two-dimensional motion (e.g., a translation in x direction and a translation in y direction which is orthogonal to the x direction, respectively) so as to move sequentially the specific region of the object to be detected, which region is labeled by 'R' as illustrated and referred to as "specific region" hereinafter, into respective visual scopes (referred to as "visible region(s)" hereinafter) of both the aiming device 12 and the electron beam detection device 11; more specifically, the first field of view of the aiming device 12 is projected onto a first visible region of the top surface, e.g., whether a reflection of an additional reflecting device may be utilized or not, and the second field of view of the electron beam detection device 11 is projected onto a second visible region of the top surface along an optical path of the electron beam, and respective centers of the first visible region and the second visible region are arranged to space apart from each other.

And for example, the electron beam detection apparatus 10 operates in a vacuum environment, e.g., it is placed in a vacuum chamber, so as to minimize an attenuation of the electron beam due to atmosphere.

Then an exemplary workflow of the electron beam detection apparatus 10 as above is set forth in detail hereinafter. Above all, in a condition that the object to be detected 20 is placed on the stage 13, the stage 13 performs a planar two-dimensional motion depending on an alignment scheme as preset by a software electronic control system so as to deliver the object to be detected 20 (e.g., the silicon wafer to be detected) into an observation field of view of the aiming device 12 (i.e., equivalent to the first visible region which is formed on the top surface from a projection of the first field of view of the aiming device 12, whether an additional reflection effect is utilized or not). Then, the aiming device 12 acquires image(s) of the object to be detected 20 by optical imaging, and moreover, implements both pre-alignment and coarse positioning for the object to be detected just by processing the collected optical image with a specific algorithm software, so as to determine specific coordinates of the position of the object to be detected 20 within in the device coordinate system of the whole electron beam detection apparatus 10. Next, the stage 13 delivers the specific region 'R' of the object to be detected 20 into an observation field of view of the electron beam detection device 11 (i.e., equivalent to the second visible region which is formed on the top surface from a projection of the second field of view of the electron beam detection device 11, the projection being implemented along the optical path of the electron beam) for fine positioning, and in turn performs a detection of pattern(s) by electron beam at high resolution.

It can be seen that, by additionally providing the aiming device 12 in the exemplary electron beam detection apparatus 10, then, the specific region 'R', which is to be detected, of the object to be detected 20 may be delivered into the observation field of view of the electron beam detection device accurately by merely two phases of single movement (i.e., these two phases are as follows, respectively: the pre-alignment and coarse positioning, which may be implemented by moving the stage 13 into the observation field of view of the aiming device 12 depending on the alignment scheme as preset; and the fine positioning, which may be implemented by using the stage 13 to deliver the specific region 'R', which is to be detected, of the object to be detected 20 into the observation field of view of the electron beam detection device 11), avoiding frequently moving the stage for alignment in order to position the specific region 'R', which is to be detected, of the object to be detected 20 into the observation field of view of the electron beam detection device.

Furthermore, by way of example, when the electron beam detection device performs the detection of pattern(s) on the silicon wafer (e.g., a silicon wafer having a diameter of 300 mm, which is referred to as 300 mm silicon wafer hereinafter), if it is required that respective pattern of any region on the silicon wafer may be detected, then it is necessary that the observation field of view of the aiming device 12 is capable of covering the entire silicon wafer due to the movement of the sage. As to the 300 mm silicon wafer, it is correspondingly required that a stroke of the stage 13 must be at least 300 mm. In other words, the stroke of the stage 13 in either one of two-dimensional directions of a plane should be necessarily greater than or equal to the diameter of the silicon wafer to be detected.

In the exemplary electron beam detection apparatus 10, FIG. 2 illustrates, in the device coordinate system of the electron beam detection apparatus, specific arrangements of respective visible regions of both the aiming device 12 and the electron beam detection device 11 in the electron beam detection apparatus 10 as illustrated in FIG. 1. Since optical axes of both the aiming device 12 and the electron beam detection device 11 are perpendicular to the top surface of the stage, then respective visible regions thereof may be considered to be projections of their respective fields of view on the top surface; specifically, the visible region of the aiming device 12, which region is labeled by '$R_{fov1}$' has a diameter of 1.5 mm, for example, and the visible region of the electron beam detection device 11, which region is labeled by '$R_{fov2}$' has a diameter of about 100 μm, the former being much larger than the latter. Moreover, in the device coordinate system of the electron beam detection apparatus, a center of the visible region '$R_{fov1}$' of the aiming device 12 for example falls on the x axis in a negative direction thereof, as illustrated; and a center of the visible region '$R_{fov2}$' of the electron beam detection device 11 for example falls on an origin 'O' of the device coordinate system of the electron beam detection apparatus, as illustrated. As illustrated in FIG. 2, a center of the silicon wafer functioning as the object to be detected 20 for example also falls on the origin 'O' of the device coordinate system of the electron beam detection apparatus, as illustrated; and a projection point of the optical axis of a lens barrel of the aiming device 12 on the device coordinate system is for example consistent with the center of the visible region '$R_{fov1}$' of the aiming device 12, and a projection point of the optical axis of the lens barrel of the electron beam detection device 11 on the device coordinate system is for example consistent with the center of the visible region '$R_{fov2}$' of the electron beam detection device 11. As illustrated, the silicon wafer functioning as the object to be detected 20 has its diameter labeled by D1 as illustrated, and the lens barrel of the electron beam detection device 11 has its diameter labeled by D2, and a lens barrel of the aiming device 12 has its diameter labeled by D3. Moreover, there are four outermost points 'a', 'b', 'c' and 'd' on a periphery of the silicon wafer (i.e., an outer circumference thereof), which are respectively located in directions of −x, +y, +x, and −y.

Then, a distance L1 between the optical axis of the aiming device 12 and the optical axis of the electron beam detection device 11 is as follows:

$$L1 = D2/2 + D3/2 \tag{1}$$

For two outermost points 'b' and 'd' which are arranged opposite to each other on the y-axis, in order to ensure that both of them enter the visible region $R_{fov1}$ of the aiming device 12 for observation, then, with the origin 'O' of the device coordinate system of the electron beam detection apparatus (the origin 'O' is also a projection point of the optical axis of the electron beam detection device 11 on the device coordinate system) being a reference, respective shifts of the stage along the y axis need to be +D1/2 and −D1/2 for these two points 'b' and 'd', respectively. Therefore, a magnitude '$S_y$' of a total stroke of the stage along the y axis is as follows:

$$S_y = |+D1/2| + |-D1/2| = D1 \tag{2}$$

And for an outermost point 'a' which is on the x axis in the negative direction thereof, in order to ensure that it enters the visible region $R_{fov1}$ of the aiming device 12, a shift of the stage along the x axis needs to be +D1/2; and for an outermost point 'c' which is on the x axis in a positive direction thereof, in order to ensure that it enters the visible region $R_{fov1}$ of the aiming device 12, then a shift of the stage along the x axis needs to be −(D1/2+L1). Therefore, a magnitude '$S_x$' of a total stroke of the stage along the x axis is as follows:

$$S_x = |+D1/2| + |-(D1/2+L1)| = D1 + L1 \tag{3}$$

This means that, in the exemplary electron beam detection apparatus 10 described above, due to the presence of the aiming device 12 additionally provided, and also due to the presence of a distance 'L1' between the first optical axis of the aiming device 12 and the second optical axis of the electron beam detection device 11 (which distance is also a center distance between the two visible regions '$R_{fov1}$' and '$R_{fov2}$'), then the stroke of the stage will be increased by L1 in a direction in which the first optical axis of the aiming device 12 is spaced apart from the second optical axis of the electron beam detection device 11 (i.e., the direction of x axis, as illustrated); and the larger the diameter D2 of the electron beam detection device 11 and the diameter D3 of the aiming device 12 are, the larger the stroke $S_x$ on the x-axis becomes. Moreover, based on the workflow of the above exemplary electron beam detection apparatus 10 for silicon wafer detection, it can be known that, the specific region 'R', which is to be detected, on the silicon wafer, may above all be subjected to coarse positioning in the visible region '$R_{fov1}$' of the aiming device 12 and then be subjected to fine positioning and detection in the visible region '$R_{fov2}$' of the electron beam detection device 11; and between the phase of coarse positioning and the phase of fine positioning, the stage 13 needs to move at least L1 so as to implement a switching of the specific region 'R', which is to be detected, on the silicon wafer, between the visible region '$R_{fov1}$' of the aiming device 12 and the visible region '$R_{fov2}$' of the electron beam detection device 11.

In a condition of specific arrangements of respective visible regions of both the aiming device 12 and the electron beam detection device 11, as illustrated in FIG. 2, it can be known that, on the one hand, since the stroke $S_x$ of the stage on the x-axis is larger than the stroke $S_y$ on the y-axis by L1, a difficulty in machining the stage will be increased accordingly, and a kinematic accuracy of the stage will be decreased simultaneously, which fact may adversely influence a detection accuracy of the stage and increase a difficulty in controlling the whole system; in addition, both size and weight of a vacuum chamber for accommodating the electron beam detection apparatus 10 will be increased, resulting in an increased overall occupied area and an increased manufacturing cost, and adversely affecting an efficiency in a vacuumizing operation and hereby increasing a load of a vibration isolator which is provided to associate with the electron beam detection apparatus 10. On the other hand, since each individual specific region 'R', which is to be detected, on the silicon wafer will be subjected to coarse positioning and then be subjected to fine positioning, i.e., will be switched sequentially from the visible region '$R_{fov1}$' of the aiming device 12 to the visible region '$R_{fov2}$' of the electron beam detection device 11. During this period of switching, each of an accelerated motion, a uniform motion, and a decelerated motion of the stage will take a period of time; therefore, the more the number of the individual specific regions 'R', which are to be detected, on the silicon wafer is, the longer the time spent in the motions of the stage becomes, which fact will influence an overall detection efficiency of the apparatus.

Figure 3:
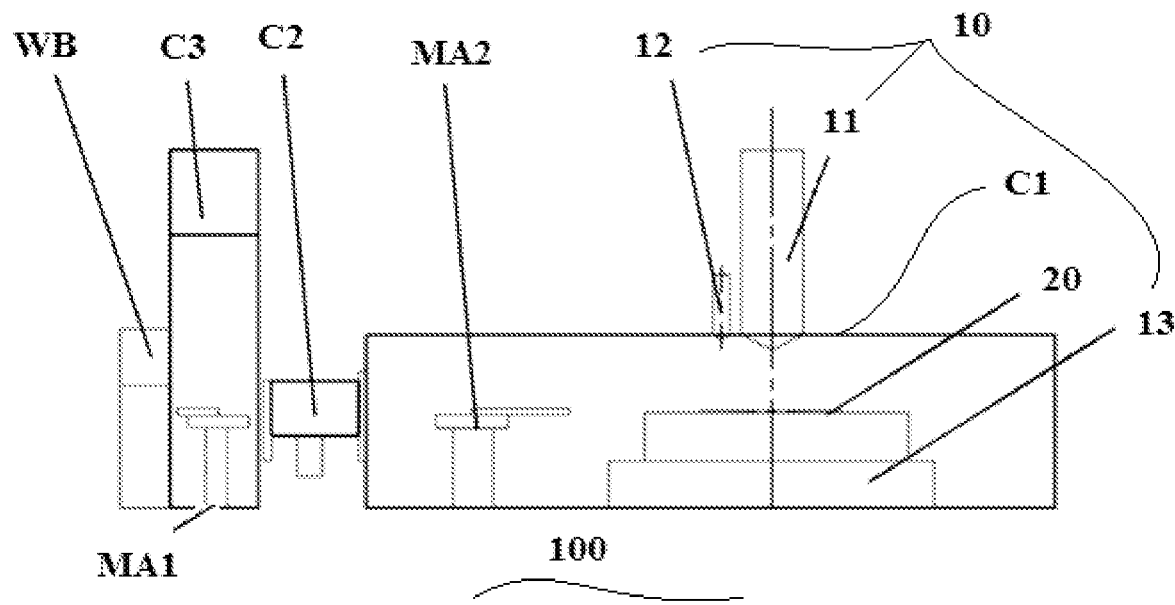
FIG. 3 illustrates a structural schematic view of an electron beam detection assembly comprising the electron beam detection device as illustrated in FIG. 1.

FIG. 3 illustrates a structural schematic view of an electron beam detection assembly 100 comprising the electron beam detection device as illustrated in FIG. 1. The exemplary electron beam detection assembly 100 for example comprises a detection module and a transmission module. More specifically, the detection module comprises: a first chamber C1, whose interior is in a vacuum condition; and the electron beam detection apparatus 10 as discussed above, which is located within the first chamber C1. And the transmission module comprises: a second chamber C2, which is provided adjacent to the first chamber C1, the second chamber communicating at one side thereof with the first chamber C1 via a first valve, and communicating at the other side thereof opposite to the one side with an atmospheric environment via a second valve; a first mechanical arm MA1, which is provided outside the second chamber C2 (e.g., in a third chamber C3) and configured to move the semiconductor device 20 into the second chamber C2 from the atmospheric environment; and a second mechanical arm MA2, which is provided within the first chamber C1 and configured to move the semiconductor device 20 into the first chamber C1 from the second chamber C2, and in turn to the top surface of the stage 13. And for example, the semiconductor device 20 to be detected (e.g., the silicon wafer) is typically accommodated in a wafer box labeled 'WB' in the atmospheric environment, and is moved into the second chamber C2 by the first mechanical arm MA1 in the third chamber C3, at the beginning of detection. In addition, for example, the second chamber C2 is configured to be vacuumized in a condition that both the first valve and the second valve are turned off at the same time.

The exemplary electron beam detection assembly comprises the exemplary electron beam detection apparatus; and due to the presence of the center distance between the visible regions '$R_{fov1}$' of the aiming device 12 and the visible region '$R_{fov2}$' of the electron beam detection device 11, the stroke of the stage will be increased and the overall detection efficiency of the apparatus will be decreased, without repeating herein any more.

FIGS. 4A to 4D illustrate structural schematic views of the electron beam detection apparatus according to embodiments of the present disclosure. FIG. 5 illustrates in a top view, respective visible regions of both the aiming device and the electron beam detection device, in the electron beam detection apparatus as illustrated in FIG. 4A to FIG. 4D.

A general technical concept of following embodiments of the disclosure lies in that, by rearranging the aiming device 12 and the electron beam detection device 11 to implement a concentric arrangement of their respective visible regions on the top surface of the stage, the center distance L1 between their respective visible regions may be omitted thereby, so as to at least partially improve the electron beam detection apparatus according to aforementioned exemplary embodiments. According to the general technical concept of these embodiments of the disclosure, as illustrated in FIG. 4A to FIG. 4D, in one aspect of embodiments of the disclosure, an electron beam detection apparatus 30 for a semiconductor device 40 is provided, comprising: a stage 33, which is configured to carry and hold the semiconductor device 40 at a top surface of the stage, and is translatable in two directions orthogonal to each other; an aiming device 32, configured to determine a position of the semiconductor device in a coordinate system of the electron beam detection apparatus by capturing an image of the semiconductor device, the aiming device being provided with a first field of view and a first optical axis; and an electron beam detection device 31, configured to detect an emergent electron beam exiting the semiconductor device by projecting an electron beam to the semiconductor device, the electron beam detection device being provided with a second field of view and a second optical axis which is at a non-zero angle with reference to the first optical axis. And the electron beam detection apparatus further comprises a reflecting device 34 configured to image a region to be detected 'R' on the semiconductor device into the aiming device by reflection of the region to be detected on the semiconductor device implemented by the reflecting device towards the aiming device; and as can be seen in FIG. 5 in which both the aiming device and the electron beam detection device of the electron beam detection apparatus of FIGS. 4A to 4E are shown in a top view, the first field of view is projected onto a first visible region '$R_{fov1}$' of the top surface by reflection of the reflecting device 34, and the second field of view is projected onto a second visible region '$R_{fov2}$' of the top surface along an optical path of the electron beam, the second visible region '$R_{fov2}$' being arranged concentrically with the first visible region '$R_{fov1}$'.

By such an arrangement, in particular, by the reflecting device 34 additionally provided, a change or diversion in orientation of the optical path of the aiming device 32 is implemented, and then, in a condition that the aiming device 32 is provided as close as possible to the electron beam detection device 31, a zero center distance between the first visible region '$R_{fov1}$' of the aiming device 32 and the second visible region '$R_{fov2}$' of the electron beam detection device 31 is implemented at the top surface of the stage (in other words, the first visible region '$R_{fov1}$' and the second visible region '$R_{fov2}$' are arranged concentrically with each other there) in such a way that the first optical axis, in its entire optical path, is not necessarily consistent with the second optical axis, thus avoiding undesired increase in the stroke of the stage and undesired decrease in the overall detection efficiency of the apparatus due to the presence of any non-zero center distance.

At the same time, also by such an arrangement, for implement a zero center distance between the first visible region '$R_{fov1}$' of the aiming device 32 and the second visible region '$R_{fov2}$' of the electron beam detection device 31, it is unnecessary to directly align the aiming device 32 concentrically with the electron beam detection device 31 or to directly sleeve the aiming device 32 concentrically on the electron beam detection device 31 (i.e., it is unnecessary to maintain a consistence between the first optical axis and the second optical axis throughout entire optical path of the aiming device 32). As such, a zero center distance between the first visible region '$R_{fov1}$' and the second visible region '$R_{fov2}$' is implemented at the top surface in an arrangement of components which has a relatively simple optical path and saves space, without directly aligning the aiming device 32 concentrically with the electron beam detection device 31 or directly sleeving the aiming device 32 concentrically on the electron beam detection device 31 for necessarily maintaining a consistence between the first optical axis and the second optical axis throughout entire optical path of the apparatus; further, it also avoids influence on both a vacuum seal condition inside the electron beam detection device 31 and a normal propagation of the electron beam due to a direct provision of the parts and components of the aiming device 32 itself in the optical path of the electron beam of the electron beam detection device 31.

Figures 4A, 4B:
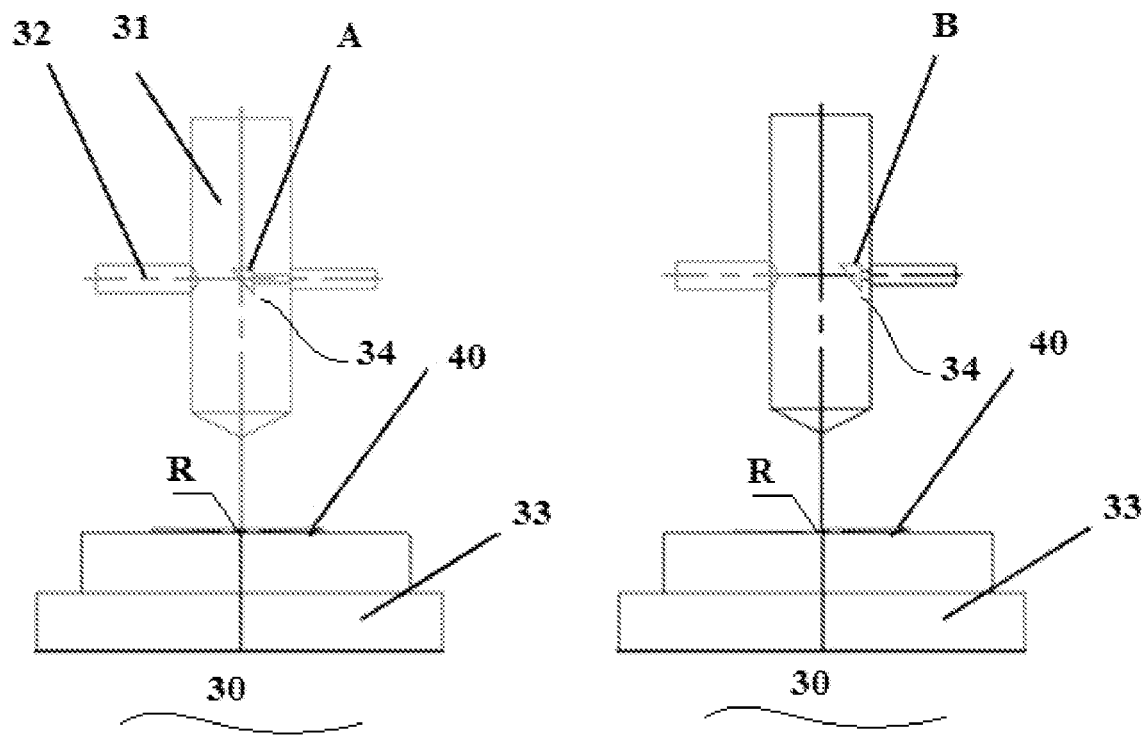
FIG. 4A to FIG. 4C illustrate structural schematic views of the electron beam detection apparatus according to embodiments of the present disclosure, wherein a first optical axis of the aiming device and a second optical axis of the electron beam detection apparatus intersect with each other orthogonally, a reflecting device is located at a first position A as shown in FIG. 4A and has been moved to a second position B as shown in FIG. 4B, and has been rotated to another second position B' as shown in FIG. 4C.
Figure 4C:
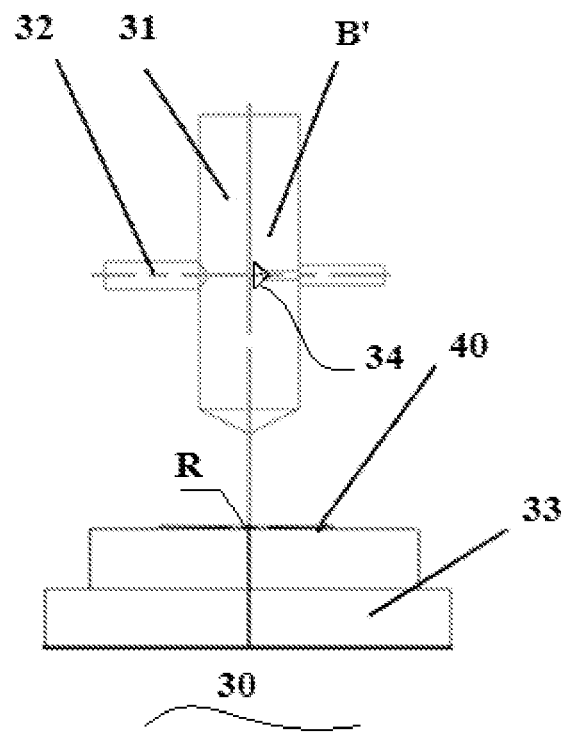
Figure 5:
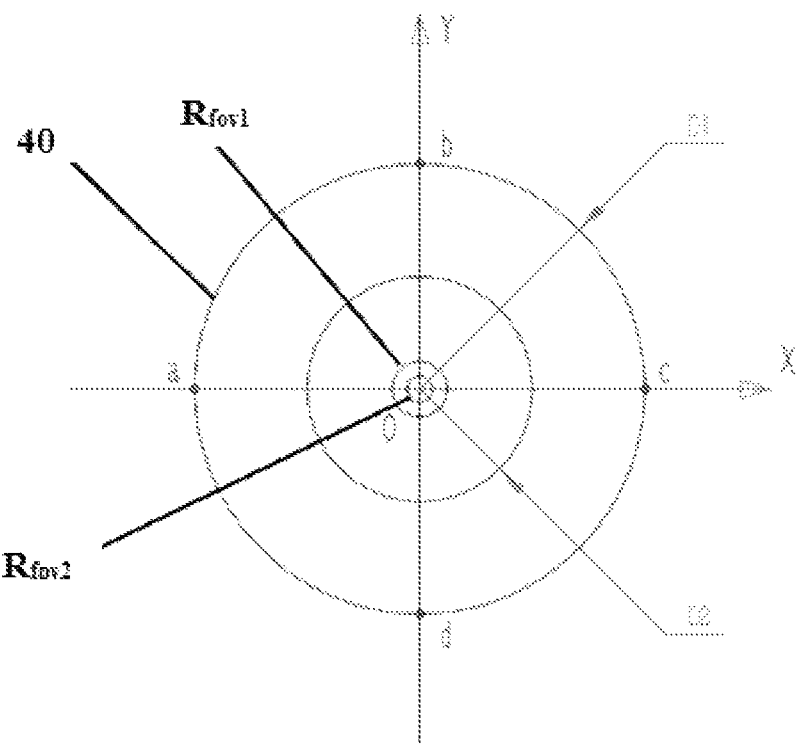
FIG. 5 illustrates in a top view, respective visible regions of both the aiming device and the electron beam detection device, in the electron beam detection apparatus as illustrated in FIG. 4A to FIG. 4D.

FIG. 4A to FIG. 4C illustrate structural schematic views of the electron beam detection apparatus according to embodiments of the present disclosure, wherein a first optical axis of the aiming device and a second optical axis of the electron beam detection apparatus intersect with each other orthogonally, a reflecting device is located at a first position A as shown in FIG. 4A and has been moved to a second position B as shown in FIG. 4B, and has been rotated to another second position B' as shown in FIG. 4C.

In further embodiments of the present disclosure, by way of example, the reflecting device 34 may be switched between the first position A as illustrated in FIG. 4A and the second position B, B' as illustrated respectively in FIG. 4B, FIG. 4C. The first position A is an operative position of the reflecting device 34, and the region to be detected is imaged into the first field of view of the aiming device by reflection of the reflecting device 34 located at the first position A. By way of example, as illustrated in FIG. 4A, the first position A is for example in the optical path of the electron beam. And each second position B, B' may be a non-operative position or an idle position of the reflecting device 34 deviating from the optical path of the electron beam, so as not to block or interrupt the optical path of the electron beam of the electron beam detection device 31 in an operative condition.

By utilizing such a switching in positions of the reflecting device 34, it is ensured that the aiming device 32 and the electron beam detection device 31 will neither operate at the same time nor interfere with respective optical paths.

More specifically, for example, when the reflecting device 34 is located at the first position A, the electron beam detection device is turned off, and the region to be detected R is located in the first visible region $R_{fov1}$. When the reflecting device 34 is located at the second position B, B', the electron beam detection device is turned on, and the region to be detected R is located in the second visual region $R_{fov2}$. Therefore, as the reflecting device 34 switches between the first position A and the second position B, B', the region to be detected R on the semiconductor device (e.g., the silicon wafer) switches between the first visible region $R_{fov1}$ of the aiming device 32 and the second visible region $R_{fov2}$ of the electron beam detection device 31; and due to the zero center distance between the first visible region $R_{fov1}$ and the second visible region $R_{fov2}$, an overall stroke of the stage along the x axis and an overall stroke of the stage along the y axis maintain consistent with each other during the switching.

By the switching in position of the reflecting device 34, and the setting of the reflecting device where the aiming device 32 and the electron beam detection device 31 do not operate at the same time, it may further be ensured that the aiming device 32 and the electron beam detection device 31 may not interfere with respective optical paths.

In a more specific embodiments, e.g., as illustrated in FIG. 4A and FIG. 4B, the reflecting device may be driven by a motor to move between the first position A and the second position B, so as to realize a switching thereof between the two positions A and B.

In more specific alternative embodiments, e.g., as illustrated in FIG. 4A and FIG. 4C, the reflecting device 34 may also be driven by a motor to rotate between the first position A and the second position B'; by way of example, when the reflecting device 34 is located at the first position A, it reflects the light which comes from the first visible region $R_{fov1}$ at the top surface towards the aiming device 32 so as to achieve a specular imaging inside the aiming device 32, and at that time it for example blocks the optical path of the electron beam detection device 31; and once the reflecting device 34 rotates to the second position B', it fails to block the optical path of the electron beam of the electron beam detection device 31. As such, a switching thereof between these two positions A and B' may also be facilitated.

In embodiments of the disclosure, by way of example, the first optical axis and the second optical axis intersect with each other at a non-zero angle.

In exemplary embodiments, for example, the first optical axis and the second optical axis intersect with each other orthogonally, as illustrated in FIG. 4A and FIG. 4B, such that a center distance between the first visible region $R_{fov1}$ and the second visible region $R_{fov2}$ is zero, i.e., the first visible region $R_{fov1}$ and the second visible region $R_{fov2}$ are arranged concentrically with each other.

Further, by way of example, as illustrated in FIG. 4A, the first optical axis is parallel to the top surface, and the second optical axis is perpendicular to the top surface. More specifically, as illustrated, at the first position A, a normal of a reflecting surface of the reflecting device 34 is coplanar with the first optical axis and the second optical axis, and forms an angle of 45° with reference to each of the first optical axis and the second optical axis. As such, a ray of light (e.g., natural light or ambient light) which is incident from the region to be detected R towards the reflecting device 34 in a vertical direction as illustrated, is reflected by the reflecting surface of the reflecting device 34 into the first field of view of the aiming device 32 so as to implement imaging by reflection. A change or diversion in orientation of the optical path of the ray of light which is imaged from the region to be detected R into the aiming device 32, is implemented by the reflection of the reflecting device 34, such that the center distance between the first visible region $R_{fov1}$ and the second visible region $R_{fov2}$ at the top surface of the stage carrying the semiconductor device to be detected is zero, in an arrangement of components which has a relatively simple optical path and saves space, without any necessity of maintaining the first optical axis and the second optical axis always in consistence with each other in the entire optical path of the aiming device 32.

Figure 4D:
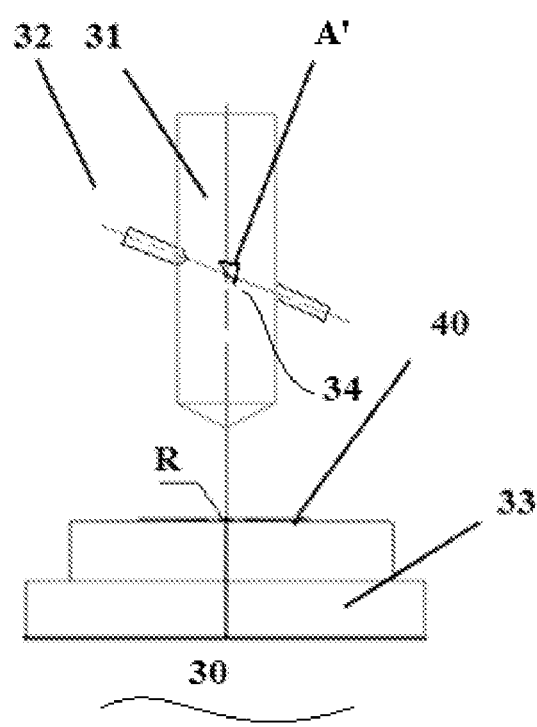
FIG. 4D and FIG. 4E illustrate structural schematic views of the electron beam detection apparatus according to embodiments of the present disclosure, wherein the first optical axis of the aiming device and the second optical axis of the electron beam detection apparatus are arranged to intersect with each other obliquely at an acute angle or at an obtuse angle, the reflecting device is located at another first position A' as shown in FIG. 4D, and has been moved to yet another second position B''' as shown in FIG. 4E.
Figure 4E:
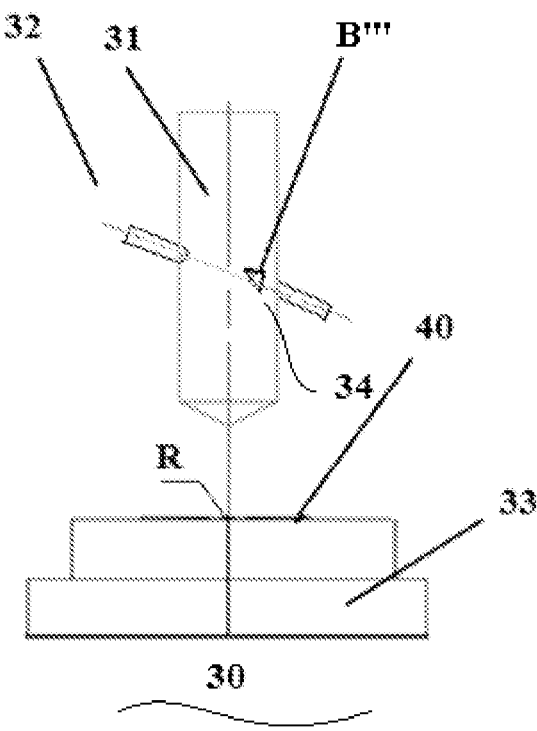

FIG. 4D and FIG. 4E illustrate structural schematic views of the electron beam detection apparatus according to embodiments of the present disclosure, wherein the first optical axis of the aiming device and the second optical axis of the electron beam detection apparatus may be arranged to intersect with each other obliquely at an acute angle or at an obtuse angle, the reflecting device is located at another first position A' as shown in FIG. 4D, and has been moved to yet another second position B''' as shown in FIG. 4E.

In alternative exemplary embodiments, for example, as illustrated in FIG. 4D and FIG. 4(e), the first optical axis and the second optical axis may be arranged to intersect with each other obliquely at an acute angle or at an obtuse angle, such that the center distance between the first visible region $R_{fov1}$ and the second visible region $R_{fov2}$ is zero, i.e., the first visible region $R_{fov1}$ and the second visible region $R_{fov2}$ are arranged concentrically with each other. As such, it also facilitates that the center distance between the first visible region $R_{fov1}$ and the second visible region $R_{fov2}$ at the top surface of the stage carrying the semiconductor device to be detected is zero, in an arrangement of components which has a relatively simple optical path and saves space, without any necessity of maintaining the first optical axis and the second optical axis always in consistence with each other in the entire optical path of the aiming device 32.

In embodiments of the present disclosure, the aiming device 32 is, for example, an optical microscope.

In embodiments of the present disclosure, the electron beam detection device 31 for example more specifically comprises: an electron beam source 35, configured to emit the electron beam as an incident electron beam; a deflector 36, configured to deflect the incident electron beam onto a surface to be detected of the semiconductor device; and an electronic detector 37, configured to image the surface to be detected of the semiconductor device, by detecting the emergent electron beam (e.g., secondary electrons, backscattered electrons) which is generated by projecting the incident electron beam onto the surface to be detected and then exists the surface to be detected of the semiconductor device.

In embodiments of the present disclosure, the electron beam detection apparatus 30 for example further comprises a control circuit 38, for example as illustrated in FIG. 7. FIG. 8 illustrates an exemplary workflow of a control circuit of the electron beam detection apparatus. As illustrated in FIG. 8, the control circuit 38 is configured to control the stage to translate depending on an alignment scheme as preset so as to move the semiconductor device into the first visible region, to determine the position of the semiconductor device in the coordinate system of the electron beam detection apparatus by processing the image of the semiconductor device which is captured by the aiming device; and to control the stage to move the region to be detected on the semiconductor device into the second visible region from the first visible region.

Figure 6A:
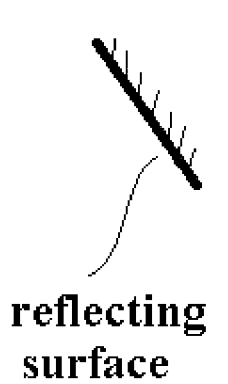
FIG. 6A to FIG. 6C illustrate exemplary specific forms of the reflecting device.
Figure 6B:
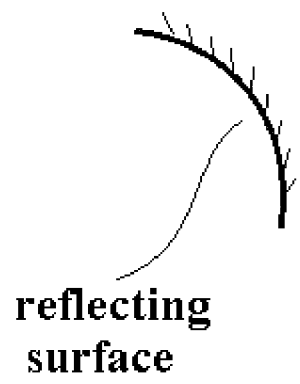
Figure 6C:
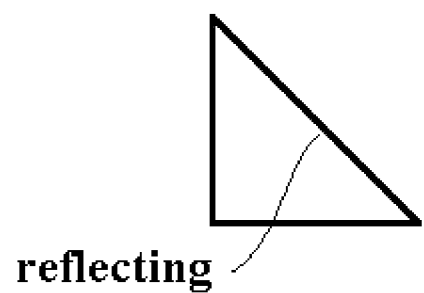

In embodiments of the disclosure, exemplary specific forms of the reflecting device are illustrated in FIG. 6A to FIG. 6C, the reflecting device 34 for example comprises one of the following: a plane mirror, a curved mirror, a reflecting prism.

FIG. 7 illustrates a structural schematic view of an electron beam detection assembly comprising the electron beam detection apparatus as illustrated in FIGS. 4A to 4D.

According to the general technical concept of these embodiments of the disclosure, as illustrated in FIG. 7, in the other aspect of embodiments of the disclosure, an electron beam detection assembly 300 comprising the electron beam detection apparatus 30 is further provided, comprising a detection module and a transmission module. More specifically, the detection module comprises: a first chamber C1', whose interior is in a vacuum condition; and the electron beam detection apparatus 30 as above, which is located within the first chamber C1'. Furthermore, the transmission module comprises: a second chamber C2', which is provided adjacent to the first chamber C1', the second chamber C2' communicating at one side thereof with the first chamber C1' via a first valve, and communicating at the other side thereof opposite to the one side with an atmospheric environment via a second valve; a first mechanical arm MA1', which is provided outside the second chamber C2' and configured to move the semiconductor device 40 into the second chamber C2' from the atmospheric environment; and a second mechanical arm MA2', which is provided within the first chamber C1' and configured to move the semiconductor device 40 into the first chamber C1' from the second chamber C2', and in turn to the top surface of the stage 33.

By providing the second chamber C2' which functions as a transition region between the atmospheric environment and the first chamber C1' serving as an operative environment, an detection operation of the electron beam detection apparatus within the first chamber C1' may be carried out while the second chamber C2' is vacuumized, thereby realizing a continuous detection process of a transmission and the detection of the semiconductor device (e.g., the silicon wafer) both implemented in parallel.

Also, in embodiments of the disclosure, by way of example, the second chamber C2' is configured to be vacuumized when both the first valve and the second valve are turned off at the same time. It is ensured that the electron detection apparatus operates in a vacuum environment, not only avoiding the interference of the environment with the detection but also avoiding the attenuation of the electron beam due to the atmosphere.

In addition, in embodiments of the present disclosure, a volume of the second chamber is smaller than that of the first chamber. Therefore, since the second chamber C2' is provided to function as the transition region between the atmospheric environment and the first chamber C1' serving as an operative environment, and since the volume of the second chamber C2' is smaller than that of the first chamber C1', then, the second chamber C2' is vacuumized at a faster speed than a speed at which the first chamber C1' is vacuumized. When it is desired to transfer the silicon wafer to the first chamber C1' from the atmosphere, the second chamber C2' above all reaches the atmospheric condition; and since the first chamber C1' is spaced apart from the second chamber C2' by the first valve, then the first chamber C1' is still in the vacuum condition. The silicon wafer is above all delivered into the second chamber C2', and then the second chamber C2' is vacuumized (since it has a relatively smaller volume than that of the first chamber, it may be vacuumized quickly to reach the vacuum condition), and next the first valve is opened so as to allow the silicon wafer to pass therethrough into the first chamber C1'. As such, the detection efficiency of the apparatus may be enhanced significantly. When two or more silicon wafers are placed within the second chamber C2', a normal detection in the first chamber C1' may be implemented during the delivery of the silicon wafer.

The electron beam detection assembly according to embodiments of the disclosure comprises aforementioned electron beam detection apparatus, and thus may have same or similar specific structure and technical effects as compared with the electron beam detection apparatus, without being repeated herein any more.

The embodiment of the disclosure has the following superior technical effects:

An electron beam detection apparatus for a semiconductor device and an electron beam detection assembly are provided in embodiments of the present disclosure. In the electron beam detection apparatus, in addition to a stage capable of performing a two-dimensional planar motion and an electron beam detection device (e.g., a scanning electron microscope), the electron beam detection apparatus may also comprise a aiming device and a reflecting device which is configured to image the region to be detected of the semiconductor device into the aiming device by reflection; and due to the presence of reflecting device, a first field of view of the aiming device is projected to a first visible region on a top surface of the stage by the reflection of the reflecting device, and a second field of view of the electron beam detection device is projected along an optical path of the electron beam to a second visible region on the top surface, the second visible region and the first visible region being arranged concentrically with each other, resulting in that a zero center distance between respective visible regions of the aiming device 12 and the electron beam detection device 11, i.e., the first visible region and the second visible region are arranged concentrically with each other, such that the stage has a uniform stroke in two dimensional direction of the plane, consumes less time for movement of the stage during the operation of the apparatus, and improves the overall detection efficiency of the apparatus.

In addition, according to the aforementioned embodiments of the present disclosure, it can be understood that any technical solution formed by any two or more combinations falls into the scope of protection of the present disclosure.

The embodiments of the present disclosure are described in a progressive manner. Each embodiment focuses on respective differences from other embodiments, and the same and similar parts among embodiments can be referred to each other or one another.

The above is only a better embodiment of the invention and does not limit the invention. Any modification, equivalent replacement, improvement, etc. made within the spirit and principles of the invention shall be comprised in the protection scope of the invention.

What is claimed is:

1. An electron beam detection apparatus for a semiconductor device, comprising:
    a stage, which is configured to carry and hold the semiconductor device at a top surface of the stage, and is translatable in two directions orthogonal to each other;
    an optical microscope, configured to determine a position of the semiconductor device in a coordinate system of the electron beam detection apparatus by capturing an image of the semiconductor device, the optical microscope being provided with a first field of view and a first optical axis; and
    an electron beam detection device, configured to detect, by an electronic detector, an emergent electron beam exiting the semiconductor device by projecting an electron beam from an electron beam source to the semiconductor device, the electron beam detection device being provided with a second field of view and a second optical axis which is not consistent with the first optical axis,
    wherein the electron beam detection apparatus further comprises a reflecting device configured to image a region to be detected on the semiconductor device into the optical microscope by reflection of the region to be detected on the semiconductor device implemented by the reflecting device towards the optical microscope,
    wherein the first field of view is projected onto a first visible region of the top surface by reflection of the reflecting device, and the second field of view is projected onto a second visible region of the top surface along an optical path of the electron beam,
    wherein the reflecting device comprises one of a plane mirror, a curved mirror, or a reflecting prism, and
    wherein in response to the first visible region and the second visible region being arranged concentrically with each other at their respective centers, the reflecting device is switchable between a first position at which the region to be detected on the semiconductor device is imaged into the first field of view of the optical microscope by reflection of the region to be detected on the semiconductor device implemented by the reflecting device located thereat and a second position deviating from the optical path of the electron beam.

2. The electron beam detection apparatus according to claim 1, wherein the first optical axis is at a non-zero angle with reference to the second optical axis, and the first visible region and the second visible region are arranged to space apart from each other at their respective centers or arranged concentrically with each other at their respective centers.

3. The electron beam detection apparatus according to claim 1, wherein the reflecting device is movable between the first position and the second position.

4. The electron beam detection apparatus according to claim 1, wherein the reflecting device is rotatable between the first position and the second position.

5. The electron beam detection apparatus according to claim 1,
    wherein in response to the reflecting device being located at the first position, the electron beam detection device is configured to be turned off, and the region to be detected on the semiconductor device is located within the first visible region, and
    wherein in response to the reflecting device being located at the second position, the electron beam detection device is configured to be turned on, and the region to be detected on the semiconductor device is located within the second visible region.

6. The electron beam detection apparatus according to claim 1, wherein the first position is in the optical path of the electron beam.

7. The electron beam detection apparatus according to claim 1, wherein the first optical axis and the second optical axis intersect with each other at a non-zero angle.

8. The electron beam detection apparatus according to claim 7, wherein the first optical axis and the second optical axis intersect with each other orthogonally.

9. The electron beam detection apparatus according to claim 8, wherein the first optical axis is parallel to the top surface, while the second optical axis is perpendicular to the top surface.

10. The electron beam detection apparatus according to claim 8, wherein at the first position, a normal of a reflecting surface of the reflecting device is coplanar with both the first optical axis and the second optical axis, and is at an angle of 45° with reference to each of the first optical axis and the second optical axis.

11. The electron beam detection apparatus according to claim 7, wherein the first optical axis and the second optical axis intersect with each other obliquely.

12. The electron beam detection apparatus according to claim 1, wherein the electron beam source is configured to emit the electron beam as an incident electron beam, and wherein the electron beam detection device comprises:
    a deflector, configured to deflect the incident electron beam onto a surface to be detected of the semiconductor device,
    wherein the electronic detector is configured to image the surface to be detected of the semiconductor device, by detecting the emergent electron beam which is generated by projecting the incident electron beam onto the surface to be detected and then exists the surface to be detected of the semiconductor device.

13. The electron beam detection apparatus according to claim 1,
    wherein the stage is translatable depending on an alignment scheme that is preset such that the semiconductor device is in the first visible region, wherein the position of the semiconductor device in the coordinate system of the electron beam detection apparatus is determined by processing the image of the semiconductor device captured by the optical microscope, and wherein the stage is configured to move the region to be detected on the semiconductor device into the second visible region from the first visible region.

14. An electron beam detection assembly, comprising:
a detection module, comprising:
  a first chamber whose interior is in a vacuum condition; and
  the electron beam detection apparatus according to claim 1, which is located within the first chamber, and
a transmission module, comprising:
  a second chamber, which is provided adjacent to the first chamber, the second chamber communicating at one side thereof with the first chamber via a first valve, and communicating at another side thereof opposite to the one side with an atmospheric environment via a second valve;
  a first mechanical arm, which is provided outside the second chamber and configured to move the semiconductor device into the second chamber from the atmospheric environment; and
  a second mechanical arm, which is provided within the first chamber and configured to move the semiconductor device into the first chamber from the second chamber, and in turn to the top surface of the stage.

15. The electron beam detection assembly according to claim 14, wherein the second chamber is configured to be vacuumized when the first valve and the second valve are turned off simultaneously.

16. The electron beam detection assembly according to claim 14, wherein a volume of the second chamber is smaller than that of the first chamber.

* * * * *